United States Patent [19]
Fiddes et al.

[11] Patent Number: 5,379,019
[45] Date of Patent: Jan. 3, 1995

[54] APPARATUS FOR EMBOSSING SUPERCONDUCTING TAPE FOR USE IN A SUPERCONDUCTING MAGNET

[75] Inventors: Neil G. Fiddes, Columbia; Christopher G. King, Florence; Gerhard S. Kobus; Anthony Mantone, both of Effingham; Frank D. Shaffer, Quimby, all of S.C.

[73] Assignee: General Electric Company, Milwaukee, Wis.

[21] Appl. No.: 134,456

[22] Filed: Oct. 12, 1993

[51] Int. Cl.[6] .................. H01F 1/00; H01L 39/24; B31F 1/20
[52] U.S. Cl. .................. 335/216; 29/DIG. 23; 29/599; 156/209; 427/290; 427/328; 427/62
[58] Field of Search ............ 29/DIG. 23, 599; 156/209; 335/216; 69/2; 427/290, 292, 62, 63, 304, 305, 328, 329

[56] References Cited

U.S. PATENT DOCUMENTS

| | | | |
|---|---|---|---|
| 3,737,824 | 6/1973 | Coles | 336/200 |
| 4,776,912 | 10/1988 | Laval | 156/209 |
| 4,902,366 | 2/1990 | Bader | 156/296 |
| 5,045,527 | 9/1991 | Ikeno | 505/1 |
| 5,096,527 | 3/1992 | Biagiotti | 156/209 |
| 5,215,617 | 6/1993 | Grupe | 156/209 |
| 5,252,800 | 10/1993 | Kosky | 219/85.1 |

Primary Examiner—Leo P. Picard
Assistant Examiner—Stephen T. Ryan
Attorney, Agent, or Firm—Irving M. Freedman; John H. Pilarski

[57] ABSTRACT

An apparatus for manufacturing embossed foil for use in controlling the flow of the molten metal tin plating provided in forming laminated tape for use in superconducting magnets utilizing meshing knurling rollers with truncated paramydical elements arranged to provide and embossed pattern for uniform and controlled flow of the tin.

14 Claims, 2 Drawing Sheets

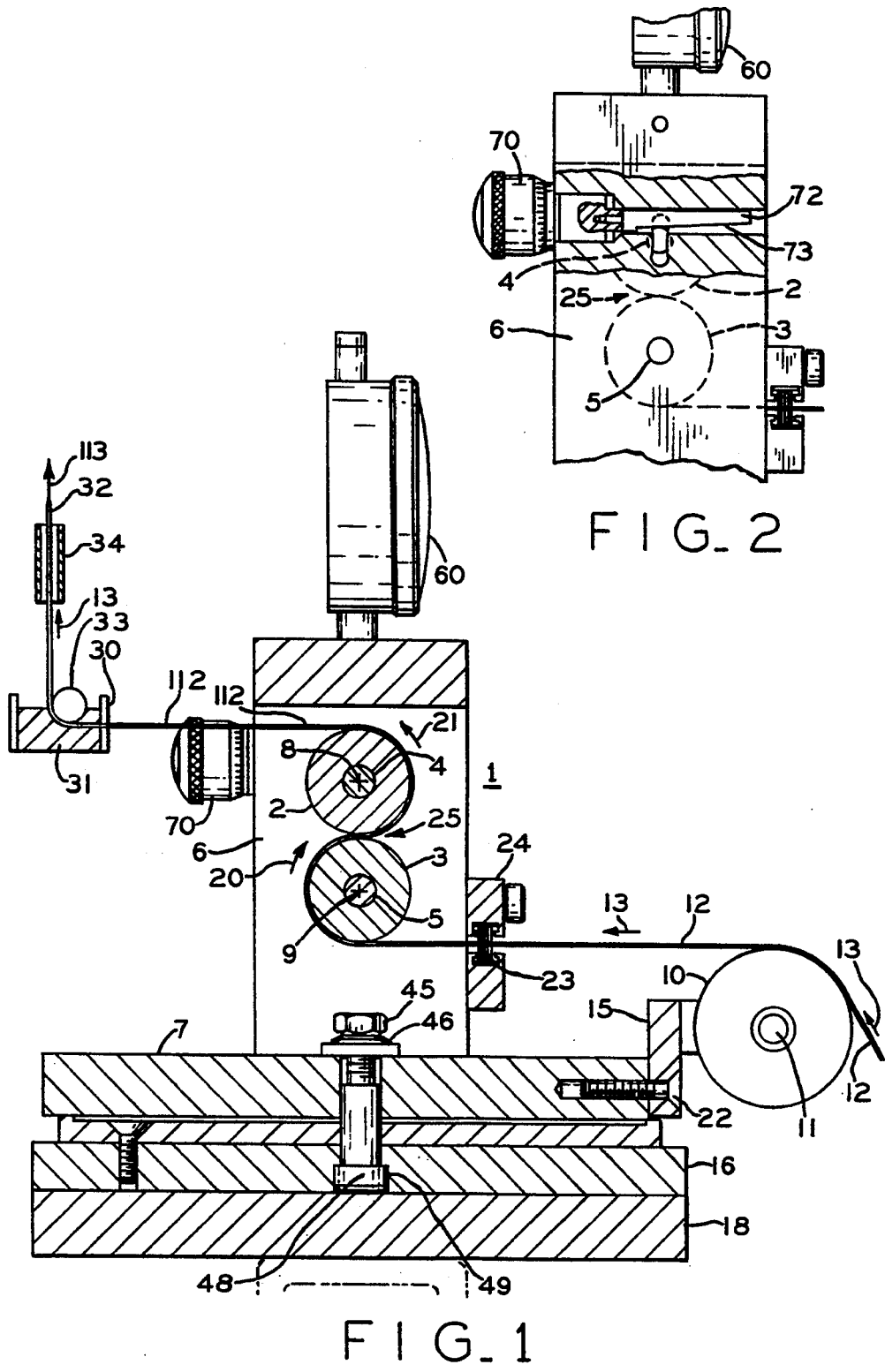
FIG_2
FIG_1

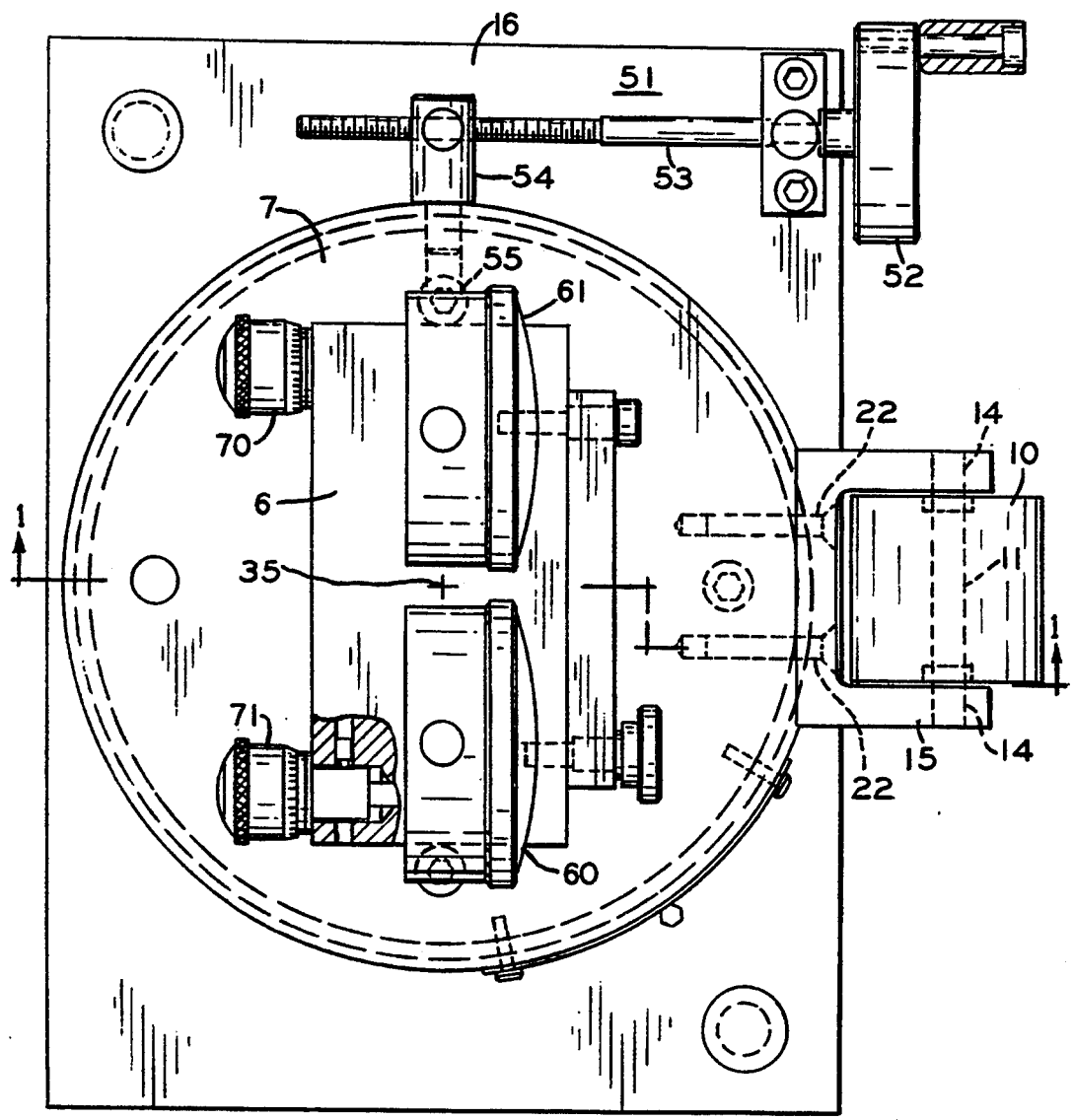
FIG_3
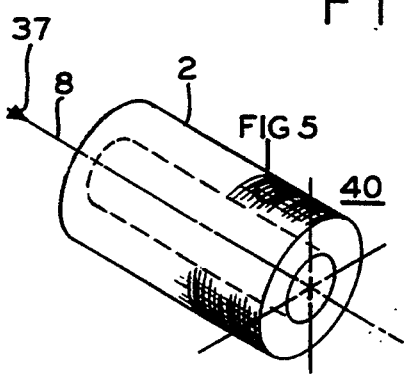
FIG_4
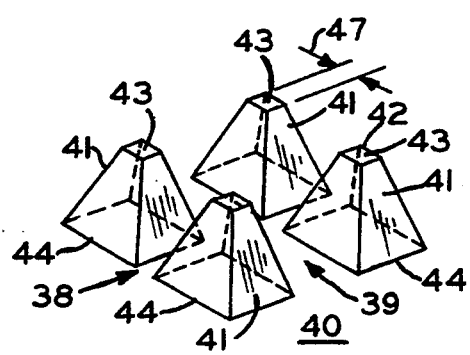
FIG_5

APPARATUS FOR EMBOSSING SUPERCONDUCTING TAPE FOR USE IN A SUPERCONDUCTING MAGNET

BACKGROUND OF INVENTION

This invention relates to an apparatus for manufacturing embossed foil for tape, such as $Nb_3Sn$ tape, suitable for use in superconducting magnets.

As is well known, a magnet can be made superconducting by placing it in an extremely cold environment, such as by enclosing it in a cryostat or pressure vessel containing liquid helium or other cryogen. The extreme cold reduces the resistance in the magnetic coils to negligible levels, such that when a power source is initially connected to the coil (for a period, for example, of ten minutes) to introduce a current flow through the coils, the current will continue to flow through the coils due to the negligible coil resistance even after power is removed, thereby maintaining a magnetic field. Superconducting magnets find wide application, for example, in the field of magnetic resonance imaging (hereinafter called "MRI").

Considerable research and development efforts have been directed at eliminating the need for a boiling cryogen, such as liquid helium, and in providing superconducting magnets which maintain the magnetic state and do not "quench," or discontinue superconductivity. However, the differential thermal expansion and contraction between materials in superconducting magnets, which are cycled from ambient temperature to temperatures in the range of absolute zero ($-270°$ C.), and the extremely large magnetic forces provided, and utilized in a MRI lead to conflicting properties required of the materials, including the superconducting tapes used. In addition, the desired layered superconducting magnet materials for superconducting tapes such as $Nb_3Sn$ are often relatively brittle and difficult to fabricate, and to handle, in winding coils.

Improved materials for use in fabricating superconducting magnets and associated superconducting tapes are disclosed in the copending United States patent application of Bu-Xin Xu, R. Jaykumar and John Wollan, entitled "Persistent Superconducting Switch for Conduction-Cooled Superconducting Magnet," Ser. No. 08/001,692 filed Jan. 7, 1993; and the copending patent application of Bu-Xin Xu and John Wollan, entitled "Stable Flux-Jumping Resistant Superconducting Tape and Superconducting Magnet," application Ser. No. 07/984,819, filed Dec. 3, 1992, both of which are assigned to the same assignee as the present invention and are hereby incorporated by reference. The subject invention is suitable for use in manufacturing superconducting tapes of the types disclosed in the aforementioned copending patent applications.

However, the manufacture of multilayer tape, such as $Nb_3Sn$ tape, suitable for superconducting use in MRI involves passing long lengths of NbZr through a molten tin bath. A persistent problem encountered in such a process is controlling the rate and uniformity of the tin flow on the surface of the NbZr foil during the reaction sequence in forming $Nb_3Sn$. Patterning or embossing the NbZr foil such as by knurling can provide a surface foil topography which can better accept and control the flow and plating of the liquid tin in a tin bath.

In developing suitable equipment to form an embossed pattern on the foil by passing the foil through a knurling roll, a plurality of problems were encountered. The use of a knurling roll pressing on the foil, when backed by a compliant, but hard rubber roller resulted in the foil tending to "cup up" rather than lay flat. Another problem encountered is controlling the travel of the foil through the knurl rolls, that is steering the foil without it wandering in a lateral direction axial to the axis of the knurling roll. The tearing of the extremely thin NbZr foil, 0.001 inches thick, and problems in obtaining uniform depth of the embossed pattern were also encountered along with problems created by stress or cracks in the foil which can degrade the critical current carrying capability of the superconducting tape.

OBJECTS AND SUMMARY OF INVENTION

It is an object of the present invention to provide an improved apparatus for the fabrication of superconducting tape suitable for use in superconducting magnets for use in MRI equipment.

It is another object of the present invention to provide an improved apparatus for producing superconducting foil with an embossed pattern to control the rate and uniformity of tin flow on the surface of the foil during the tin coating of the foil and the reaction of the foil to form $Nb_3Sn$.

It is yet another object of the present invention to provide an improved apparatus for the embossing of superconducting foil with a uniform and symmetrical pattern and in which the positioning of the foil, and pressure on the foil, in passing through the apparatus can be accurately controlled.

Still another object of the present invention is to provide an improved apparatus for the fabrication of superconducting tape utilizing an embossed foil which minimizes problems of tearing of the foil, and which avoids stress or cracks in the foil.

In accordance with one form of the invention, apparatus is provided for embossing long lengths of foil for use in multi-layer tape for superconducting magnets in order to control the flow of the liquid metal layer formed on the surface of the foil and which utilizes a pair of rotatable knurling rollers positioned contiguous to each other and forming a pinch region between their circumferential surfaces. A repetitive knurled pattern on the circumferential surfaces of the knurling rollers are pressed against the foil to impress the pattern of the knurled surfaces onto the foil. The knurled patterns include projections shaped and positioned so as to mesh with, or nest within, each other in the pinch region to positively grip the foil as it passes through the pinch region. Wandering in the axial direction is controlled by passing the foil through an S-shaped configuration around the knurling rollers such that the rotation of the foil is first in one direction and then in the opposite direction. The knurling pattern consists of a plurality of truncated pyramids having a square base with flatted but rounded tops, with the bases contiguous to each other and in alignment to provide a series of valleys for tin flow which are aligned both circumferentially and radially relative to the axis of rotation.

control means are provided to adjust the pressure of the rollers on the foil, and also to adjust the axial positioning of the foil as it passes through the rollers. The foil is NbZr and the liquid layers of tin is flowed to provide a $Nb_3Sn$ tape in which the embossed tape in passing through a molten tin bath utilizes the embossed pattern to control the uniformity of the flow of the tin on the surfaces of the foil.

BRIEF DESCRIPTION OF INVENTION

FIG. 1 is a sectional side view showing the present invention.

FIG. 2 is a portion of FIG. 1 with the pressure adjustment means shown in section.

FIG. 3 is a top view of FIG. 1 with the line 1—1 showing the cross-section of FIG. 1.

FIG. 4 is a prospective view illustrating the positioning of the knurling pattern on a knurling roller.

FIG. 5 is an enlarged view of a portion of FIG. 4 showing the elements of the pattern on the knurling roller.

Referring to FIGS. 1–5, and in particular to FIGS. 1 and 3, knurling assembly 1 includes a pair of rotatably mounted knurling rollers 2 and 3 rotatably mounted for rotation about their axes 8 and 9, respectively, through their shafts 4 and 5, respectively, rotatably mounted on bearing surfaces within U-shaped housing 6. Housing 6 in turn is secured to rotatable base 7.

Also secured to base 7 by suitable fastening means, such as screws 22, is idler or guide pulley 10 with its shaft 11 rotatably supported within bearings 14 (as best shown in FIG. 3). Foil 12, which may be NbZr, is passed from a supply spool (not shown) in the direction shown by arrow 13 by means 113 such that it passes over guide pulley 10 through brushes 23 of foil cleaner 24, to pass around the left hand side of knurling roller 3 which rotates clockwise in the direction shown by arrow 20, then through the pinch or embossing region 25 between knurling rollers 2 and 3, and around the right hand side of knurling roller 2 which rotates in a counter-clockwise direction as shown by arrow 21.

Pressure is applied urging pinch rollers 2 and 3 toward one another such that the knurling pattern, described below, is embossed on foil 12 in pinch or embossing region 25.

The embossed tape 112, after passing through pinch or embossing region 25 is subsequently passed through molten tin 31 in heated vessel 30 around pulley 33 and subsequently through reaction oven 34 to provide a superconducting Nb$_3$Sn tape 32 suitable for use in the winding of superconducting magnet coils for MRI use. The embossed pattern formed on foil 12 in embossing region 25 controls a uniform tin flow on the surface of the NbZr foil 112 during passage through molten tin 31 and during the reaction of the foil to form Nb$_3$Sn in reaction oven 34 where the tin flow is influenced by gravity since the embossed tape is moving vertically through the reaction oven.

Knurling assembly 1 includes means to maintain uniform pressure on foil 12 at embossing region 25, and also includes means to "steer" or control the axial position of foil 12 in the embossing region. Dial indicators 60 and 61, which may be Starrett series 25 indicators, are positioned with their sensors in contact with the left and right sides of shaft 8 to indicate the depth of the embossing impression on foil 12 and thus enables control of the depth of the impression and thus the pressure being exerted by knurling rollers 2 and 3, respectively, against or toward foil 12 while precision pressure control knobs 70 and 71, respectively, are provided to accurately and independently control the pressure exerted to floating axle 4 on each side of knurling roller 2 to insure uniform desired embossing across the foil.

FIG. 2 includes a cutaway section showing the details of the pressure control mechanism associated with pressure control knob 70. Referring to FIG. 2, pressure control knob 70 controls the axial movement of pressure actuator 72 radially to axis 8 and includes camming surface 73 in contact with shaft 4 of knurling roller 2. As pressure actuator 72 is moved to the right camming surface 73 applies increasing pressure against shaft 4 moving it toward embossing region 25 to increase pressure of knurling roller 2 against foil 12. Pressure control knob 70 may be a Starrett special micrometer identified by their model number 464P. Pressure control knob 71 is used to actuate a pressure actuator and camming surface similar to 72 and 73 associated with pressure control knob 70.

In order to control the axial position or direction of travel of foil 12 as it passes around knurling rollers 2 and 3, and through embossing region 25, a steering or position control assembly 51 is provided on base 16 to rotate circular plate 7 about axis 35 on which knurling assembly 1 is rotatably mounted. Steering control assembly 51 (see FIG. 3) includes steering control knob 52 connected through threaded shaft 53 and motion transfer yoke mechanism 54 attached to circular plate 7 to move the yoke mechanism along the threaded shaft, and through a floating pivot point in the yoke mechanism apply pressure through roller 55 to housing 6 in an arc about axis 35 to rotate plate 7 and knurling rollers 2 and 3 around axis 35. Rotation of plate 7 along with knurling rollers 2 and 3 about axis 35 to enable limited steering control of foil 12 in passing through embossing region 25.

As pointed out above, it is important that the rate and uniformity of tin flow on the surface of foil 12 while passing through molten tin 31 and when reflowed in reaction over 34 be controlled. The tin is picked up as a coating on foil 112 during passage through molten tin 31 and is subsequently reheated and reflowed in reaction oven 34 with the flow being a gravity flow which is an even flow enhanced and enabled by the embossed pattern impressed on foil 12 in embossing region 25. The particular embossing pattern is best illustrated in FIGS. 4 and 5. Referring to FIGS. 4 and 5, knurling roller 2 which rotates about axis 8 includes a convex pattern on its surface consisting of a large number of aligned truncated pyramidal elements 41 having a rectangular base 44 and a generally rectangular flat crest 43 with rounded corners 42. The width of flat crests 43 of pyramidal teeth 41 is indicated by the opposed arrows, one of which is numbered 47, in FIG. 5. The normal circular pitch between elements 41 is 0.025", while the width of the flat crests is 0.0075" with the rounded corners 42 being 0.002" to 0.003". Elements 41 are arranged so that they extend with their valleys or space between adjacent bases forming channels 38 and 39 extending axially and radially, respectively, relative to axis 8 to channel or control the flow of molten tin in bath 31 (see FIG. 1). The resultant flow through the channels 38 and 39 in bath 31 and reaction oven 34 is substantially uniform, it having been determined that other flows resulting from other channel patterns, such as a diagonal valley flow across foil 112 of the molten tin results in non-uniformity of tin flow on the surface of foil 112.

The pyramidal elements or teeth 41 of knurling rollers 2 and 3 are offset by half the distance between adjacent flat crests 43 so that the pyramidal teeth 41 nest, or intermesh similar to gearing in embossing region 25. One of the knurling rollers, such as knurling roller 2, includes adjustment means shown as arrow 37 in FIG. 4 to enable a small adjustment in an axial direction along axis 8 to provide a proper offset and meshing of teeth 41 in embossing region 25 with foil 12 gripped therebetween.

The meshing teeth 41 of knurling rollers 2 and 3 provide a positive grip on and movement of foil 12 through embossing region 25 and prevents "cup up" of the foil which would result if one of the rollers were a compliant, but hard, rubber roller. Knurling assembly 1 also overcomes the plurality of problems associated with controlling the rate and uniformity of tin flow on the surface of foil 12 as it passes through molten tin bath 31. A uniform depth of the embossed pattern is obtained without danger of tearing the foil, and assists in minimizing problems of stress or cracks which would degrade the current carrying capacity of embossed tape 112. The adjustable control provided by pressure controls 70 and 71, along with the ability to steer tape 12 by rotation of base 7 and housing 6 through steering control assembly 51 enables the provision of a uniform, highly effective embossed pattern on the foil for the manufacture of high quality superconducting tape 32 suitable for use in superconducting magnet coils for MRI use.

While the present invention has been described in respect to certain preferred embodiments thereof, it is to be understood that numerous variations in the details of construction, the arrangement and combination of parts, and the type of materials used may be made without departing from the spirit and scope of the invention.

What we claim is:

1. Apparatus for uniformly embossing by deforming long lengths of foil for use in liquid coated multi-layer tape for superconducting magnets to control the flow of the liquid metal layer formed on the surface of the foil comprising:
    a pair of rotatable knurling rollers each having an axis of rotation and positioned contiguous to each other and forming an embossing region between the circumferential surfaces thereof;
    each of said circumferential surfaces including a repetitive knurled tooth pattern which substantially mesh and nest in said embossing region;
    further providing liquid metal coating means;
    means to pass said deformable foil between the meshing and nested teeth and through said embossing region to deform said foil with channels formed between the teeth of said tooth pattern to subsequently control the flow of liquid metal on the surfaces of said foil; and
    means to control the relative positioning of said knurling rollers in said embossing region to control the embossing of said knurled pattern onto said foil and said subsequent flow of liquid metal.

2. Apparatus for uniformly embossing and coating long lengths of foil for superconducting magnets of claim 1 wherein said means to pass said foil through said embossing region includes passing said foil through an S-shaped configuration to control wandering of said foil in the direction parallel to said axis of rotation to maintain meshing of said teeth.

3. Apparatus for uniformly embossing and coating long lengths of foil for superconducting magnets of claim 2 wherein said pattern on each of said rotatable knurling rollers comprises a plurality of rows of truncated pyramids to provide a knurl pattern with bases forming the flow control channels therebetween which are substantially parallel and substantially transverse to the length of the said foil; said liquid coating means including a reaction oven, and means to pass said foil vertically through said reaction oven wherein liquid metal flow is influenced by gravity and said substantially parallel and transverse channels.

4. Apparatus for uniformly embossing and coating long lengths of foil for superconducting magnets of claim 3 wherein the crests of said truncated pyramids of said pattern are flatted substantially parallel to said foil and said crests include rounded corners.

5. Apparatus for uniformly embossing long lengths of foil for superconducting magnets of claim 4 wherein the said pyramids are truncated four sided pyramids with flatted four sided tops.

6. Apparatus for uniformly embossing and coating long lengths of foil for superconducting magnets of claim 5 wherein said means to control the relative positioning of said knurling rollers includes a sensor and an adjustable camming surface for adjustably axially positioning at least one of said rotatable knurling rollers transverse to said foil in said embossing region to provide said nesting of said truncated pyramids.

7. Apparatus for uniformly embossing and coating long lengths of foil for superconducting magnets of claim 6 wherein the bases of said pyramids are with the bases positioned in alignment transverse to the direction of movement of said foil in passing through said embossing region and forming flow paths in the channels between adjacent rows of said pyramids which are transverse to the direction of movement of said foil through said embossing region.

8. Apparatus for uniformly embossing and coating long lengths of foil for superconducting magnets of claim 6 wherein said adjustment means includes an adjustable camming surface to adjust the position of one of said rollers radially to the other of said rollers to adjust the depth of the deformation and said channels.

9. Apparatus for uniformly embossing long lengths of foil for superconducting magnets of claim 1 wherein said foil is NbZr.

10. Apparatus for uniformly embossing long lengths of foil for superconducting magnets of claim 9 wherein said liquid metal layer is tin and said tape is $Nb_3Sn$.

11. Apparatus for uniformly embossing and coating long lengths of foil for superconducting magnets of claim 1 wherein adjustment means are provided to adjust the relative position of said knurling rollers along the axes thereof to adjust said mesh; and, further including means to pass the coated foil vertically through a heated reaction oven to uniformly reflow the liquid metal with the assistance of said channels.

12. Apparatus for uniformly embossing and coating long lengths of NbZr foil for use in multi-layer tin coated $Nb_3Sn$ tape for superconducting magnets to control the flow of the liquid metal layer formed on the surface of the foil comprising:
    a pair of rotatable knurling rollers each having an axis of rotation and positioned continuous to each other and forming an embossing region between the circumferential surfaces thereof;
    each of said circumferential surfaces including a repetitive knurled tooth pattern which substantially mesh in said embossing region;
    means to pass said foil between the meshing teeth and through said embossing region; and
    means to control the relative positioning of said knurling rollers in said embossing region to control the embossing of said knurled pattern onto said foil and further including a tin coating means, and means to pass said foil through a heated reaction oven with said embossed pattern controlling the flow of tin on the surfaces of said foil during formation of said Nb$_3$Sn tape.

13. Apparatus for uniformly embossing long lengths of foil for superconducting magnets of claim 12 wherein said pattern is configured to provide embossed tin flow channels substantially parallel and substantially transverse to the length of said foil.

14. Apparatus for uniformly embossing long lengths of foil for superconducting magnets of claim 13 wherein said foil is passed substantially vertically through said heated reaction oven and said flow of tin in said reaction oven is subject to the effects of gravity.

* * * * *